(12) United States Patent
Bunce et al.

(10) Patent No.: US 8,345,497 B2
(45) Date of Patent: Jan. 1, 2013

(54) INTERNAL BYPASSING OF MEMORY ARRAY DEVICES

(75) Inventors: Paul A. Bunce, Poughkeepsie, NY (US);
John D. Davis, Maybrook, NY (US);
Diana M. Henderson, Poughkeepsie, NY (US); Jigar J. Vora, Westborough, MA (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 12/822,058

(22) Filed: Jun. 23, 2010

(65) Prior Publication Data
US 2011/0317505 A1 Dec. 29, 2011

(51) Int. Cl.
*G11C 7/00* (2006.01)
(52) U.S. Cl. ..................... 365/203; 365/233.5
(58) Field of Classification Search ............. 365/203, 365/233.5
See application file for complete search history.

(56) References Cited

U.S. PATENT DOCUMENTS

| | | |
|---|---|---|
| 4,998,221 A | 3/1991 | Correale, Jr. |
| 5,146,427 A | 9/1992 | Sasaki et al. |
| 5,376,849 A | 12/1994 | Dickol et al. |
| 5,450,357 A | 9/1995 | Coffman |
| 5,612,916 A | 3/1997 | Neduva |
| 5,623,217 A | 4/1997 | Britton et al. |
| 5,726,677 A | 3/1998 | Imamura |
| 5,818,409 A | 10/1998 | Furuhashi et al. |
| 5,952,859 A | 9/1999 | Kim et al. |
| 6,061,296 A | 5/2000 | Ternullo, Jr. et al. |
| 6,084,454 A | 7/2000 | Holst |
| 6,356,473 B1 | 3/2002 | Shimoyama |
| 6,377,098 B1 | 4/2002 | Rebeor |
| 6,384,754 B1 | 5/2002 | Park |
| 6,510,089 B2 | 1/2003 | Taura et al. |
| 7,042,262 B2 | 5/2006 | Tam et al. |
| 7,075,855 B1 | 7/2006 | Bunce et al. |
| 7,233,542 B2 | 6/2007 | Bunce et al. |

(Continued)

FOREIGN PATENT DOCUMENTS
KR 100298181 B1 5/2001
(Continued)

OTHER PUBLICATIONS

IBM TDB Ristard CH; "Programmable Pulse Generator;" IP.COM Technical Disclosure; May 1, 1975.
(Continued)

*Primary Examiner* — Michael Tran
(74) *Attorney, Agent, or Firm* — Cantor Colburn LLP; William A. Kinnaman, Jr.

(57) ABSTRACT

An output control circuit for a memory array includes a latched output node precharged to a first logic state prior to both a read and write operation; first logic that couples memory cell data from a memory read path to the output node during the read operation, the first logic controlled by a timing signal; second logic that internally bypasses the memory read path during a write operation by decoupling it from the output node, such that a logical derivative of write data written to the memory array is also coupled to the output node, the second logic also controlled by the timing signal; and wherein a transition of the output node from the first logic state to a second logic state during the write operation occurs within a time range as that of the same transition during the read operation.

15 Claims, 3 Drawing Sheets

U.S. PATENT DOCUMENTS

| | | |
|---|---|---|
| 7,246,279 B2 | 7/2007 | Pendurkar |
| 7,363,526 B1 | 4/2008 | Chong et al. |
| 7,425,855 B2 | 9/2008 | Chen et al. |
| 7,443,223 B2 | 10/2008 | Bajkowski et al. |
| 7,463,545 B2 | 12/2008 | Kumala |
| 7,515,482 B2 | 4/2009 | Kim et al. |
| 7,535,776 B1 | 5/2009 | Behrends et al. |
| 7,596,053 B1 | 9/2009 | White et al. |
| 7,668,037 B2 | 2/2010 | Carpenter et al. |
| 7,710,796 B2 | 5/2010 | Cottier et al. |
| 2007/0002619 A1 | 1/2007 | Schoenauer et al. |
| 2008/0029839 A1 | 2/2008 | Hold et al. |
| 2008/0258790 A1 | 10/2008 | Branch et al. |
| 2009/0059653 A1* | 3/2009 | Luk et al. .............. 365/149 |
| 2009/0109766 A1 | 4/2009 | Terzioglu et al. |
| 2010/0039872 A1 | 2/2010 | Park et al. |
| 2011/0317496 A1 | 12/2011 | Bunce et al. |
| 2011/0317499 A1 | 12/2011 | Bunce et al. |
| 2011/0320851 A1 | 12/2011 | Bunce et al. |

FOREIGN PATENT DOCUMENTS

| | | |
|---|---|---|
| WO | 0156084 A1 | 8/2001 |

OTHER PUBLICATIONS

J. Davis et al.; "A .6GHZ 64KB Dual-Read Data Cache for the Power6 Processor," IEEE International Solid-State Circuits Conference; 2006.

IBM; "Level Shifter Incorporated into Address Pre-decode Circuit for SRAMs Employing 2 Voltage Planes;" IP.COM Technical Disclosure; Jan. 6, 2009; pp. 1-5.

IBM and Ristard; "Programmable Pulse Generator," IP.COM Technical Disclosure; May 1, 1975; pp. 1-3.

Disclosed Anonymously; "A Clocked Single Supply Level Shifter with Buit-In Firewall;" IP.COM Technical Disclosure; Feb. 3, 2009; pp. 1-5.

U.S. Appl. No. 12/822,038; Non-Final Office Action; Date Filed Jun. 23, 2010; Date Mailed: May 15, 2012; pp. 1-11.

U.S. Appl. No. 12/821,824; Non-Final Office Action; Date Filed: Jun. 23, 2010; Date Mailed: May 11, 2012; pp. 1-9.

* cited by examiner

INTERNAL BYPASSING OF MEMORY ARRAY DEVICES

BACKGROUND

The present invention relates generally to integrated circuit memory devices and, more particularly, to a method and apparatus for internal bypassing of memory array devices.

As will be appreciated by those skilled in the art, in a domino Static Random Access Memory (SRAM), the individual cells do not employ sense amplifiers to sense the differential voltage on the bit line pairs coupled to the cross-coupled inverters that store the data. Rather, for a domino SRAM, the local bit line is precharged, discharged, and the discharge is detected. The local bit line, the means to precharge the local bit line, and the detector define a dynamic node of the domino SRAM.

In a high-speed domino memory array, the array access time may vary widely, depending upon the strength of the cell device that discharges the bit line. As the wafer dimensions of these narrow devices continue to decrease, the process induced variations in fabrication continue to increase. In addition, when the array is written, the access time associated with the data driver switching the bit line can produce an even earlier effective read output of the array. Thus, an enable signal is used to control access timing to the array.

The ability to present the data being written into a memory such as an SRAM (or some logical function of the data) to the output of the memory is a feature that continues to be an issue for many applications. One approach to this problem is to write through the local bitline structure. However, as indicated above, a drawback to this write through solution is that it has become unreliable for fast, domino read style memories due to the so called "fast read before write" effect. Attempts to extend the write through solution add complexity and require additional trade offs. For example, externally bypassing the entire memory requires the addition or expansion of a series multiplexer (and possibly the addition of staging latches), which in general increases the latency and area of the memory. Since the timing of an external bypass scheme is independent of the memory, this also adds to the timing complexities of the downstream logic.

SUMMARY

In an exemplary embodiment, an output control circuit for a memory array includes a latched output node that is precharged to a first logic state prior to a read operation and prior to a write operation; first logic configured to selectively couple memory cell data from a memory read path to the output node during the read operation, the first logic controlled by a timing signal; second logic configured to internally bypass the memory read path during the write operation by decoupling the memory read path from the output node, such that a logical derivative of write data written to the memory array is also coupled to the output node through the second logic, the second logic also controlled by the timing signal; and wherein a transition of the output node from the first logic state to a second logic state during the write operation occurs within a time range as that of a transition of the output node from the first logic state to a second logic state during the read operation.

In another embodiment, an output control circuit for a memory array having an upper portion and a lower portion includes a latched output node that is precharged to a first logic state prior to a read operation and prior to a write operation; first logic in each of the upper and lower portions configured to selectively couple memory cell data from a memory read path to the output node during the read operation, the first logic controlled by a corresponding one of an upper and a lower timing signal; second logic configured to internally bypass the memory read path during the write operation by decoupling the memory read path from the output node, such that a logical derivative of write data written to the memory array is also coupled to the output node through the second logic, the second logic controlled by both the upper and lower timing signals; and wherein a transition of the output node from the first logic state to a second logic state during the write operation occurs within a time range as that of a transition of the output node from the first logic state to a second logic state during the read operation.

In another embodiment, a method of controlling an output of a memory array, includes precharging and latching an output node to a first logic state prior to a read operation and prior to a write operation; selectively coupling, with first logic, memory cell data from a memory read path to the output node during the read operation, the first logic controlled by a timing signal; internally bypassing, with second logic, the memory read path during the write operation by decoupling the memory read path from the output node, such that a logical derivative of write data written to the memory array is also coupled to the output node through the second logic, the second logic also controlled by the timing signal; and wherein a transition of the output node from the first logic state to a second logic state during the write operation occurs within a time range as that of a transition of the output node from the first logic state to a second logic state during the read operation.

BRIEF DESCRIPTION OF THE SEVERAL VIEWS OF THE DRAWINGS

Referring to the exemplary drawings wherein like elements are numbered alike.

DETAILED DESCRIPTION

Disclosed herein is a method and apparatus for internal bypassing of memory array devices. The embodiments herein address the "fast read before write" problem by internally bypassing the SRAM local bitline structure and writing the input data into an existing latch embedded internally in the memory. More specifically, the disclosed embodiments expand on an existing structure in many SRAMs that in turn allows somewhat arbitrary functions of the input data to be presented at the output of the SRAM, with similar timing as data that would normally be read from the SRAM. Since the data is presented at the output with similar timing to that of data that is read from the memory, the disclosed approach does not add to the timing complexities of the downstream logic. The embodiments herein eliminate the need for additional staging latches and downstream multiplexers.

Figure 1:
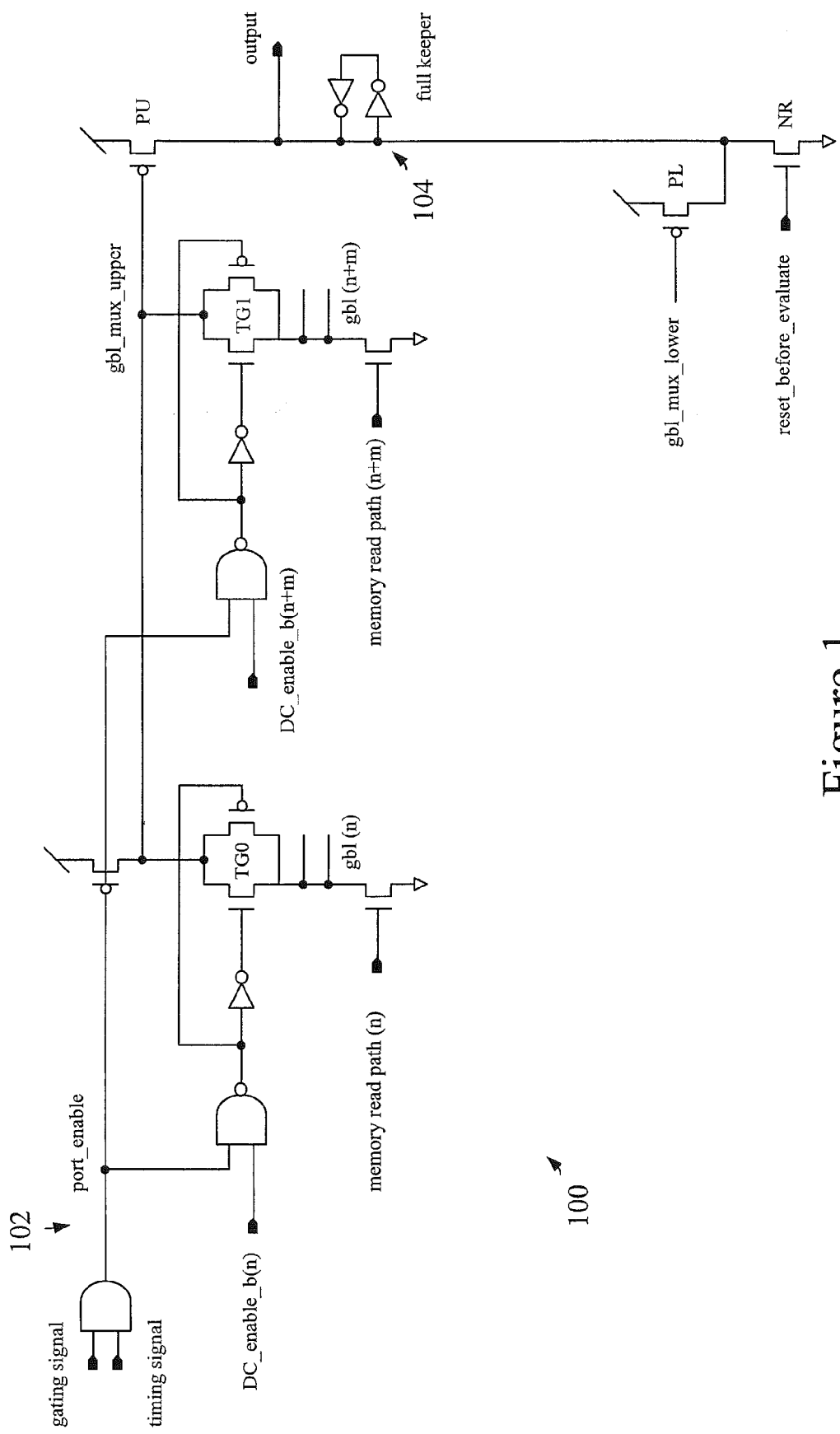
FIG. 1 is a schematic diagram of an existing memory array output control circuit.

Referring initially to FIG. 1, there is shown a schematic diagram of an existing memory array output control circuit 100 for an SRAM array. For purposes of simplicity, gating and multiplexing functions are shown for an upper portion of the SRAM array only, but it will be understood that similar circuitry is also used to perform the same functions for a lower portion of the SRAM array. As will also be appreciated, the specific gating devices (e.g., AND, NAND, etc.) shown in the figure are exemplary and could be replaced by other logically equivalent circuits.

As is shown in FIG. 1, the control circuit includes a timing/gating function, generally depicted at 102, as well as a multiplexing function depicted by transmission gate pairs TG0 and TG1, which are parallel configured n-type field effect transistor (NFET) and p-type field effect transistor (PFET) devices. The multiplexing is used to select between a nominal memory read data path, memory read path (n), and a redundant memory read data path, memory read path (n+m). For illustrative purposes, only a single global bit line gbl(n) and a single redundant global bit line gbl(n+m) are shown, although it will be appreciated that several such bit lines (e.g., 16, 32) may be present for each portion of the array.

The signal gbl_mux_upper, representing the multiplexed memory read path output is coupled to a pull up PFET PU, which determines whether the latched output node "output" is charged up from a "reset 0" state. Also, for illustrative purposes, a corresponding pull up PFET PL (controlled by the signal gbl_mux_lower) is shown for the lower portion of the SRAM array. The signal gbl_mux_lower is generated in a similar manner with respect to signal gbl_mux_upper.

In a standby state of operation, the control signals "gating signal" and "timing signal" that are inputs to AND gate 102 are at logic low, or inactive. As a result, neither the nominal memory read data path (memory read path (n)), nor the redundant memory read data path, (memory read path (n+m)) affect the output node, which is at a previous state held by a full keeper latch 104.

The inputs DC_enable_b(n) and DC_enable_b(n+m) are configured to allow only one of the two transmission gates (TG0 or TG1) to be on at a given time, in accordance with a memory redundancy scheme. During a normal read access, the reset_before_evaluate signal will temporarily pulse high, causing the pull down NFET NR and set the full keeper latch 104 and the output signal to a low state. Subsequently, both the timing signal (upper or lower) and the gating signal (i.e., read enable) will go active high, allowing the state of the selected memory read path (n or n+m) to be coupled to the full keeper latch 104 and the output. In the case where the selected memory read path contains a logic low value, the associated pull up PFET (PU or PL) remains deactivated, and thus does not disturb the latched "0" state of the output. Conversely, where the selected path contains a logic high value, the associated pull up PFET (PU or PL) is activated, causing the state of the keeper latch 104 and output to change from "0" to "1." The control signals "gating signal" and "timing signal" are such that only one of the pull up PFETs, PU or PL, is active for any given access of the memory array.

In this configuration, it will be noted that for the latter case that the time when the output changes state is determined by three separate signals, namely reset_before_evaluate, timing signal, and memory read path. The reset_before_evaluate signal determines when the output transitions to a preset low state. The timing signal has less timing variation than the memory read path signal and is designed to go active sooner than the slowest memory read path and later than the fastest memory read path.

Because the gating signal is also used for a write mode of operation, the port enable signal allows a multiplexed memory read path to be coupled to the output during a write. Thus, for the above described fast read before write scenario, if a "0" were to be written to the memory cell, but the memory cell contains a "1", then this "1" could undesirably appear on the output prior to completion of the write.

Figure 2:
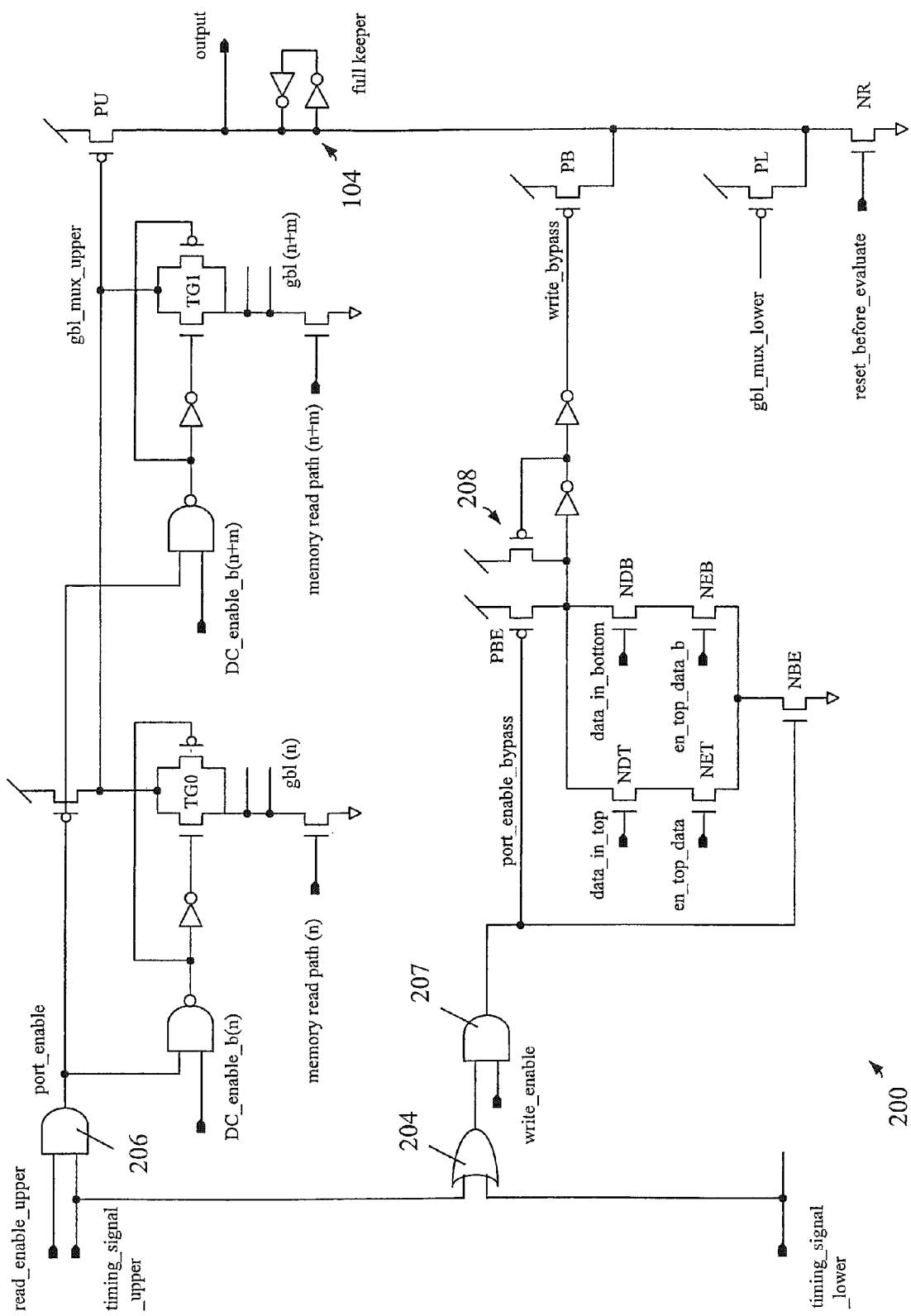
FIG. 2 is a schematic diagram of a memory array output control circuit, in accordance with an embodiment of the invention.

Accordingly, FIG. 2 is a schematic diagram of a memory array output timing control circuit 200, in accordance with an embodiment of the invention. As will be seen, a third port is effectively added to the control circuitry such that the memory read paths are completely decoupled from the output during a write mode. Instead, write data is internally directed to the output node.

For purposes of simplicity, like components with respect to FIG. 1 have the same reference designations in FIG. 2. In more detail, the control circuit 200 further provides logic gating, including OR gate 204 and AND gate 206. In contrast to FIG. 1, the control circuit 200 of FIG. 2 separates the read enable and write enable control signals. The timing signals (from both the upper and lower portions of the SRAM), however, are also used by the bypass circuitry, with the upper and lower timing signals (timing_signal_upper, timing_signal_lower) being input to the OR gate 204, the output of which is coupled to the AND gate 206. The other input to the AND gate 206 is the separate write_enable control signal.

As further shown in FIG. 2, another pull up PFET (PB) is coupled to the output node and keeper latch 104. Since the bypass circuitry services both upper and lower portions of the array, a network of pull down NFETs (NDT, NDB, NET, NEB and NBE) is used to couple write data from either the top or bottom portion of the array to the output node and keeper latch 104. NFET NBE acts as a footer device for the NFET stacks NDT/NET and NDB/NEB, with NBE activated by the output of AND gate 207, which outputs a port_enable_bypass signal. This signal also controls a header PFET PBE to maintain PB in a deactivated state when port_enable_bypass signal is low. A half latch 208 (keeper PFET) will also initially maintain the state of the input signal to PB, write_bypass, once port_enable_bypass goes active.

In the case of a read operation, the write enable signal is held low, which thereby deactivates the port_enable_bypass signal and thus PB is held off. All of the remaining devices of the circuit 200 behave as described above. In the case of a write operation, the read_enable_upper signal and corresponding read_enable_lower signal (not shown) would remain low (inactive), thus preventing memory read paths from activating PU or PL. Instead, the write_enable signal goes high (active). As is the case with a read operation, the reset_before_evaluate signal still pulses high to set the keeper latch 104 and output node to a low state. Furthermore, during a write operation, instead of the state of a memory read path being transferred to the keeper latch 104 and output node, a logical derivative of the write data into the array is transferred. In the embodiment of FIG. 2, the transferred data would be either the "data in" being written to the top half of the array (data_in_top) or to the bottom half of the array (data_in_bottom), depending on the state of the en_top_data/en_top_data_b control signal pair.

It should be appreciated that the NFET devices NDT, NDB, NET, and NEB may be replaced by any given pulldown structure and can implement many different functions. Moreover, while the exemplary embodiments depict a p-domino type circuit output node topology, the control circuit may also be implemented using an n-domino output node topology. So long as the control circuit 200 makes use of the reset_before_evaluate signal and makes use of the timing signal to generate the port_enable_bypass signal, output transitions within the same timeframe as read operations from the memory read path may be generated.

Figure 3:
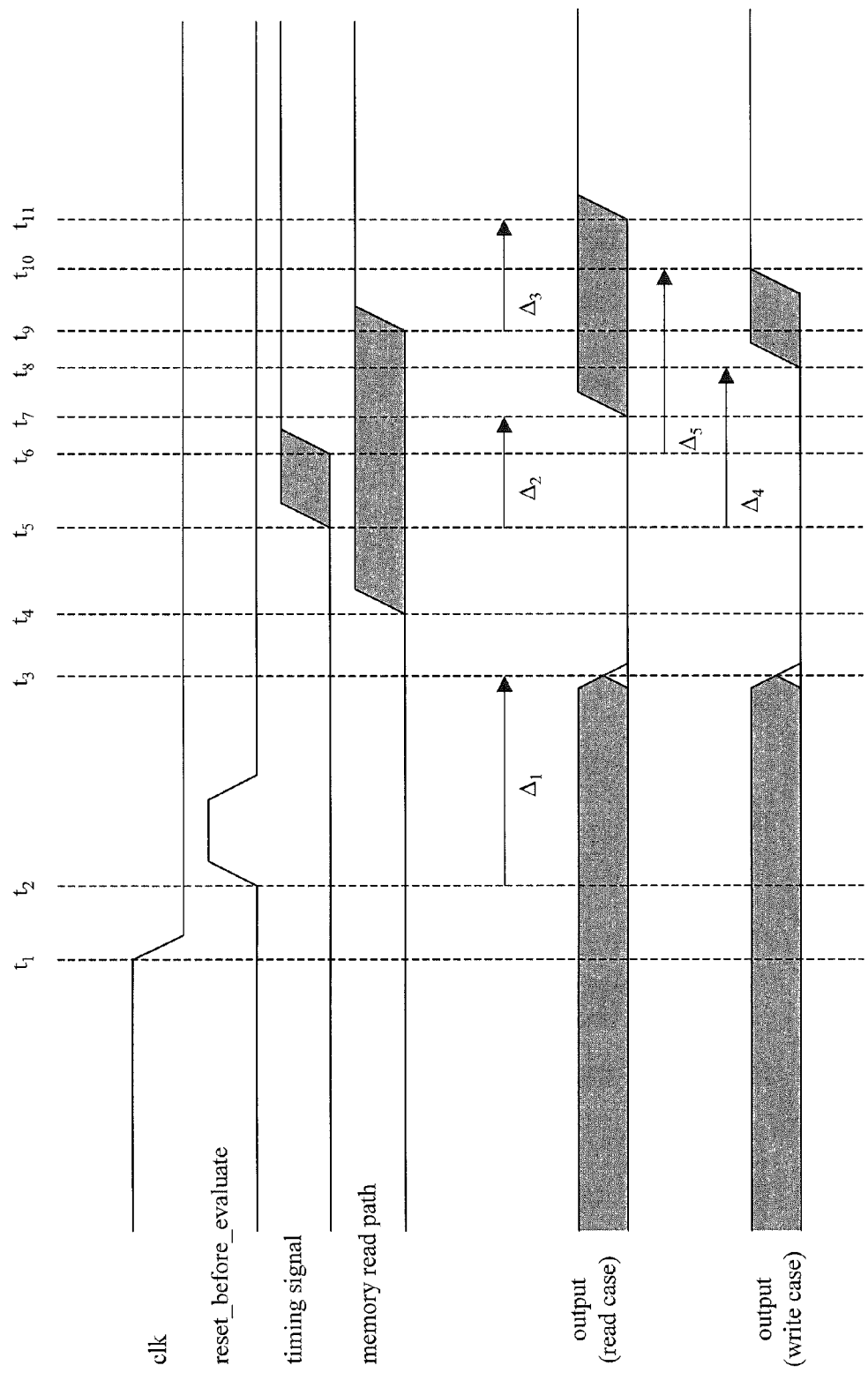
FIG. 3 is a timing diagram illustrating the operation of the control circuit of FIG. 2.

Finally, FIG. 3 is a timing diagram illustrating the various timing relationships of the signals of the control circuit of FIG. 2. Prior to time $t_1$, the control circuit is in a standby mode, with the state of the output node/keeper latch 104 assumed to be in an unknown previous state. At time $t_1$, a clock signal (clk) goes active low for a memory operation. Regardless of whether the operation is a read or write, the reset_before_evaluate signal pulses high at time $t_2$, so as to activate pull down NFET NR in FIG. 2, and latch a "0" state at the output/keeper latch at time $t_3$. The time taken for the reset signal to bring the output/keeper latch to "0" is represented by $\Delta_1$ in FIG. 3.

Time $t_4$ represents the earliest case where cell data is available for coupling to the output, pending the activation of the timing signal. Since variation of the arrival of the timing signal is between $t_5$ and $t_6$, it will be seen that the timing signal has less variation than that of the memory read path, where the latest case where cell data is available for coupling to the output is at $t_9$ (and thus the variation of the memory read path is $t_9$-$t_4$).

For the read case, where the memory read path has a rising edge transition at the earliest time $t_4$, this "1" state waits until the arrival of the timing signal before the output/keeper latch can transition from "0" to "1." If the timing signal also arrives at the earliest point in time at $t_5$, then the soonest the output/keeper latch transitions from "0" to "1" is at time $t_7$, represented by a delay $\Delta_2$ after the rise of the timing signal. On the other hand, in the case where the memory read path transition from "0" to "1" is the slowest, at time $t_9$, and given that the timing signal has already been activated (somewhere between $t_5$ and $t_6$), the output/keeper latch transitions from "0" to "1" at time $t_{11}$, represented by a delay $\Delta_3$ after the rise of the memory read path. In sum, the earliest output rising edge for a read operation is determined by the timing signal, whereas the latest output rising edge is determined by the more variable memory read path.

In contrast, for the write case, it will be seen that both the earliest and latest rising output edges are determined solely by the timing signal (which again has less variability than the memory read path). That is, the memory read path is effectively taken out of the equation by the bypass circuitry, and as a result the rising output will be within the range as determined by the read case. For the earlier case of a rising timing signal at time $t_5$, the output/keeper latch transitions from "0" to "1" at time $t_8$, represented by a delay $\Delta_4$. For the later case of a rising timing signal at time $t_6$, the output/keeper latch transitions from "0" to "1" at time $t_{10}$, represented by a delay $\Delta_5$.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An output control circuit for a memory array, comprising:
   a latched output node that is precharged to a first logic state prior to a read operation and prior to a write operation;
   first logic configured to selectively couple memory cell data from a memory read path to the output node during the read operation, the first logic controlled by a timing signal;
   second logic configured to internally bypass the memory read path during the write operation by decoupling the memory read path from the output node, such that a logical derivative of write data written to the memory array is also coupled to the output node through the second logic, the second logic also controlled by the timing signal;
   wherein a transition of the output node from the first logic state to a second logic state during the write operation occurs within a time range as that of a transition of the output node from the first logic state to a second logic state during the read operation; and
   wherein the first logic is further controlled by a read enable signal and the second logic is further controlled by a separate write enable signal.

2. The circuit of claim 1, wherein the first logic further comprises multiplexing circuitry that selects between a nominal memory read data path and a redundant memory read data path.

3. The circuit of claim 1, wherein the memory array comprises a domino static random access memory (SRAM).

4. The circuit of claim 3, further comprising:
   a pull down transistor device that precharges the output node to a logic low level;
   one or more first pull up transistor devices responsive to the first logic to pull up the output node to a logic high level in the event the memory read path is at the logic high level during a read operation; and
   a second pull up transistor device responsive to the second logic to pull up the output node to the logic high level in the event the logical derivative the of write data written to the memory array is at the logic high level during the write operation.

5. An output control circuit for a memory array having an upper portion and a lower portion, the control circuit comprising:
   a latched output node that is precharged to a first logic state prior to a read operation and prior to a write operation;
   first logic in each of the upper and lower portions configured to selectively couple memory cell data from a memory read path to the output node during the read operation, the first logic controlled by a corresponding one of an upper and a lower timing signal;
   second logic configured to internally bypass the memory read path during the write operation by decoupling the memory read path from the output node, such that a logical derivative of write data written to the memory array is also coupled to the output node through the second logic, the second logic controlled by both the upper and lower timing signals; and
   wherein a transition of the output node from the first logic state to a second logic state during the write operation occurs within a time range as that of a transition of the output node from the first logic state to a second logic state during the read operation.

6. The circuit of claim 5, wherein the first logic of the upper and lower portions is further controlled by an associated read enable signal and the second logic is further controlled by a write enable signal.

7. The circuit of claim 6, wherein the first logic of the upper and lower portions further comprises multiplexing circuitry that selects between a nominal memory read data path and a redundant memory read data path.

8. The circuit of claim 7, wherein the multiplexing circuitry comprises a plurality of NFET/PFET transmission gate pairs.

9. The circuit of claim 6, wherein the memory array comprises a domino static random access memory (SRAM).

10. The circuit of claim 8, further comprising:
a pull down transistor device that precharges the output node to a logic low level;
first pull up transistor devices associated with the upper and lower portions responsive to the first logic to pull up the output node to a logic high level in the event the memory read path is at the logic high level during a read operation; and
a second pull up transistor device responsive to the second logic to pull up the output node to the logic high level in the event the logical derivative of the write data written to the memory array is at the logic high level during the write operation.

11. The circuit of claim 10, wherein the pull down transistor device is pulsed to precharge the output node to a logic low level.

12. A method of controlling an output of a memory array, the method comprising:
precharging and latching and output node to a first logic state prior to a read operation and prior to a write operation;
selectively coupling, with first logic, memory cell data from a memory read path to the output node during the read operation, the first logic controlled by a timing signal;
internally bypassing, with second logic, the memory read path during the write operation by decoupling the memory read path from the output node, such that a logical derivative of write data written to the memory array is also coupled to the output node through the second logic, the second logic also controlled by the timing signal;
wherein a transition of the output node from the first logic state to a second logic state during the write operation occurs within a time range as that of a transition of the output node from the first logic state to a second logic state during the read operation; and
controlling the first logic by a read enable signal and controlling the second logic by a separate write enable signal.

13. The method of claim 12, wherein the first logic further comprises multiplexing circuitry that selects between a nominal memory read data path and a redundant memory read data path.

14. The method of claim 12, wherein the memory array comprises a domino static random access memory (SRAM).

15. The method of claim 14, further comprising:
precharging, with a pull down transistor device, the output node to a logic low level;
wherein one or more first pull up transistor devices is responsive to the first logic to pull up the output node to a logic high level in the event the memory read path is at the logic high level during a read operation; and
wherein a second pull up transistor device is responsive to the second logic to pull up the output node to the logic high level in the event the logical derivative the of write data written to the memory array is at the logic high level during the write operation.

* * * * *